(12) United States Patent
Unruh et al.

(10) Patent No.: US 6,597,246 B2
(45) Date of Patent: Jul. 22, 2003

(54) METHODS AND APPARATUS FOR ALTERATION OF TERMINAL COUNTS OF PHASE-LOCKED LOOPS

(75) Inventors: Eric L. Unruh, San Jose, CA (US); Scott G. Gibbons, San Jose, CA (US)

(73) Assignee: DSP Group, Inc., Santa Clara, CA (US)

( * ) Notice: Subject to any disclaimer, the term of this patent is extended or adjusted under 35 U.S.C. 154(b) by 0 days.

(21) Appl. No.: 09/855,423

(22) Filed: May 14, 2001

(65) Prior Publication Data

US 2002/0167359 A1 Nov. 14, 2002

(51) Int. Cl.[7] ............................................... H03L 7/00
(52) U.S. Cl. ............................. 331/1 A; 377/44; 377/60
(58) Field of Search ........................... 331/1 A; 377/78, 377/81, 52, 116, 44, 46–48, 56, 60, 75, 84, 87, 114, 118, 45; 327/160, 159, 151, 158

(56) References Cited

U.S. PATENT DOCUMENTS

| | | | | | |
|---|---|---|---|---|---|
| 5,066,927 A | * | 11/1991 | Dent | ........................... | 331/1 A |
| 5,373,542 A | * | 12/1994 | Sunouchi | ...................... | 377/44 |
| 5,526,391 A | * | 6/1996 | Shankar et al. | ............. | 377/118 |
| 6,031,425 A | * | 2/2000 | Hasegawa | ................... | 327/159 |
| 6,236,278 B1 | * | 5/2001 | Olgaard | ....................... | 327/156 |

* cited by examiner

*Primary Examiner*—Robert Pascal
*Assistant Examiner*—Kimberly E Glenn
(74) *Attorney, Agent, or Firm*—Morrison & Foerster LLP

(57) ABSTRACT

A phase-locked loop (PLL) includes a down counter having a detection circuit configured to determine when the counter reaches its terminal count. The down counter also includes a control line configured to alter the terminal count detected by the detection circuit by an off-set.

20 Claims, 4 Drawing Sheets

METHODS AND APPARATUS FOR ALTERATION OF TERMINAL COUNTS OF PHASE-LOCKED LOOPS

BACKGROUND OF THE INVENTION

1. Field of the Invention

The present invention generally relates to phase-locked loops (PLLs). More particularly, the present invention relates to methods and apparatus for altering terminal counts of PLLs without re-programming.

2. Description of the Related Art

Conventional PLLs typically include a voltage controlled oscillator (VCO) that generates an output signal. This output signal is compared with a reference signal in a feedback loop to control the VCO. In this manner, PLLs can generate an output signal based on a reference signal.

Conventional PLLs can also include frequency dividers to produce output signals that are multiples of the reference signals. The modulus of the frequency dividers determines the multiplication of the reference signals. For example, a frequency divider with a modulus of 2 can produce an output signal that is twice as large in frequency as the reference signal.

In some applications, such as in generating radio signals, dual-modulus prescaling can be used rather than a single variable division. In contrast to the example given above, in dual-modulus prescaling, the output signal is divided by two different moduli.

More particularly, conventional PLLs with dual-modulus prescaling typically have a main counter and an auxiliary counter. These counters are configured such that the main counter has a longer count than the auxiliary counter. During the time that both the main counter and the auxiliary counters are counting, the output signal is divided by one modulus. When the auxiliary counter stops counting and until the main counter stops counting, the output signal is divided by another modulus. Thus, the frequency of the output signal is determined in part by the number of counts of the main and auxiliary counters.

In conventional PLLs with dual-modulus prescaling, the number of counts of the main and auxiliary counters is re-programmed in order to change the frequency of the output signal. However, re-programming the main and auxiliary counters can be time consuming and result in undesirable delay. Moreover, this delay can be unacceptable in applications that require rapid changes in the output signal.

SUMMARY

The present invention relates to altering terminal counts of phase-locked loops (PLLs) without re-programming. In one embodiment of the present invention, a PLL includes a down counter having a detection circuit configured to determine when the counter reaches its terminal count. In accordance with one aspect of the present invention, the down counter also includes a control line configured to alter the terminal count detected by the detection circuit by an off-set.

DESCRIPTION OF THE DRAWING FIGURES

The present invention can be best understood by reference to the following description taken in conjunction with the accompanying drawing figures, in which like parts may be referred to by like numerals:

DETAILED DESCRIPTION OF EXEMPLARY EMBODIMENTS

In order to provide a more thorough understanding of the present invention, the following description sets forth numerous specific configurations, parameters, and the like. It should be recognized, however, that such description is not intended as a limitation on the scope of the present invention, but is instead provided to provide a better description of exemplary embodiments.

Figure 1:
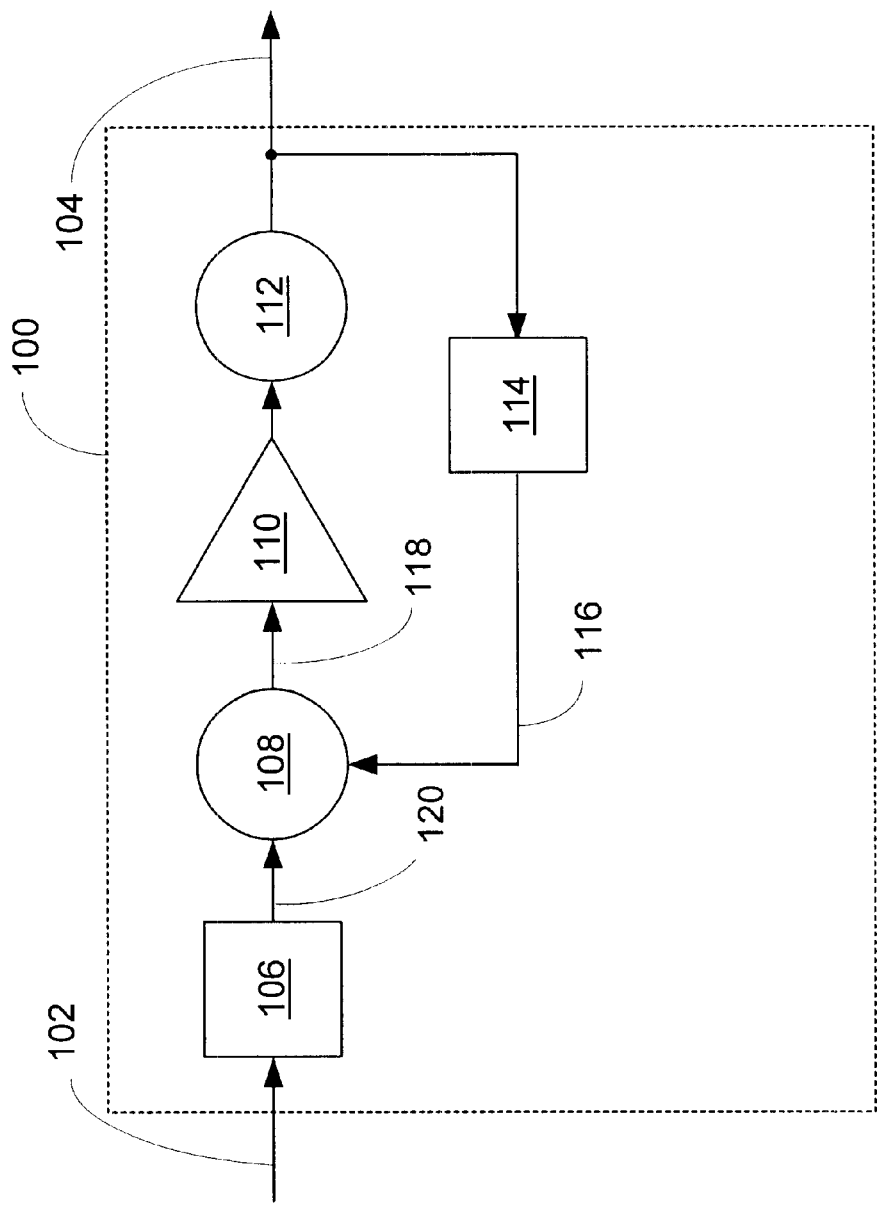
FIG. 1 is a block diagram of one exemplary PLL circuit.

With reference to FIG. 1, a phase-locked loop (PLL) circuit 100 is configured to generate an output signal 104 based on a reference signal 102. In one exemplary embodiment, PLL circuit 100 includes a phase detector 108, a loop filter 110, a voltage controlled oscillator (VCO) 112, and dividers 106 and 114.

In the present exemplary embodiment, VCO 112 generates output signal 104, which is then fed-back to phase lock output signal 104 based on reference signal 102. More particularly, divider 114 divides output signal 104 into a divided signal 116 and divider 106 divides reference signal 102 into a divided signal 120. Phase detector 108 then compares divided signal 120 to divided signal 116 to generate a control signal 118. Loop filter 110 then smoothes control signal 118 before feeding it into VCO 112.

As described above, PLL circuit 100 includes dividers 106 and 114. In the present embodiment, divider 114 is configured to divide by N, where N can be any integer value. In the present embodiment, divider 106 is configured to divide by R, where R can be any integer value. As such, output signal 104 is (N÷R) times as high as reference signal 102. Therefore, by varying the value of N, PLL circuit 100 can be configured to generate output signal 104 that corresponds to a multiple of reference signal 102.

Figure 2:
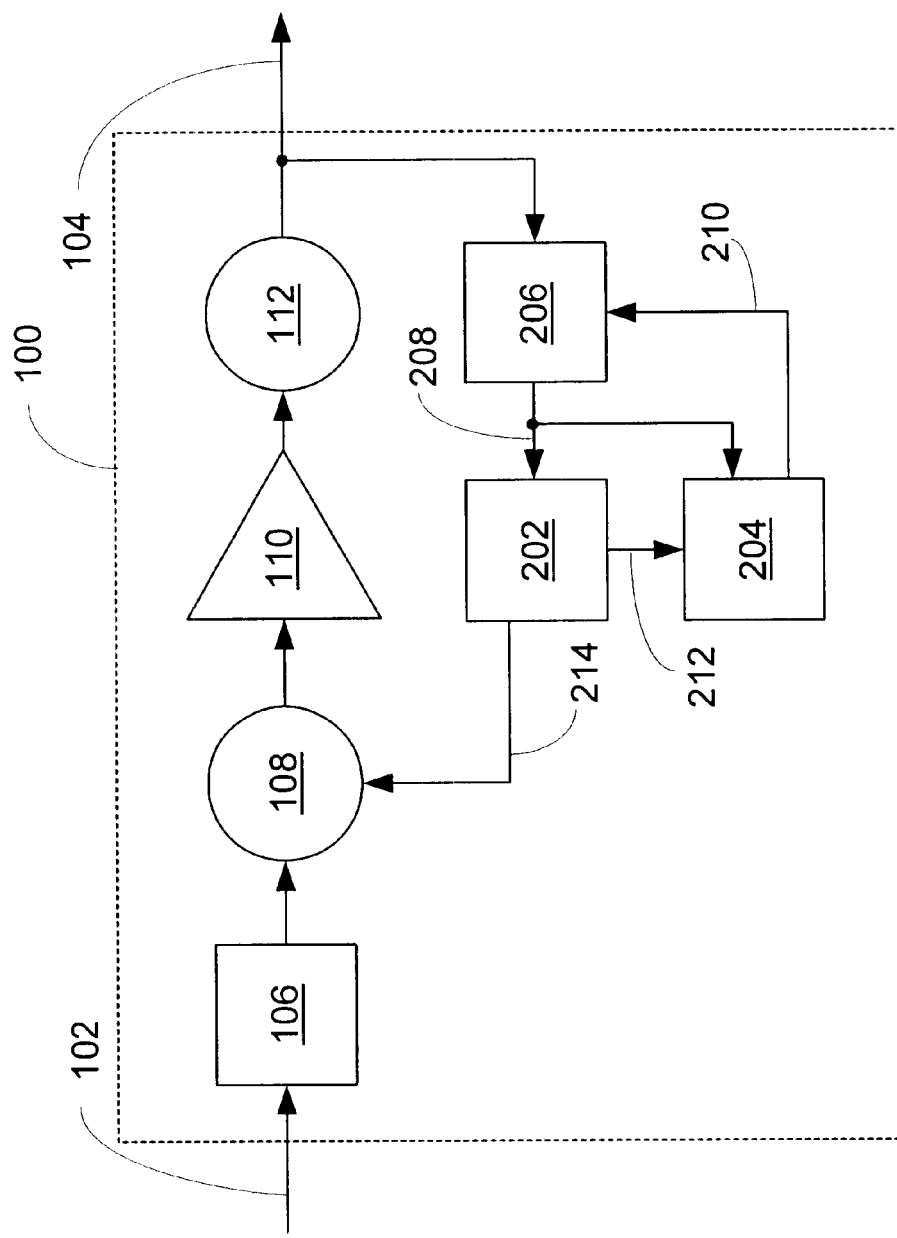
FIG. 2 is a block diagram of another exemplary PLL circuit.

With reference now to FIG. 2, in another exemplary embodiment, PLL circuit 100 includes a dual-modulus prescaler 206. In this exemplary embodiment, PLL circuit 100 also includes a Main (M) counter 202 and an Auxiliary (A) counter 204. In the present exemplary embodiment, M counter 202 and A counter 204 are configured as down-counters. As such, M counter 202 and A counter 204 count down from initial counts to terminal counts. For example, M counter 202 can be configured to count down from an initial count of 31 to a terminal count of 0 (zero).

As depicted in FIG. 2, the output signal 208 of dual-modulus prescaler 206 is applied as a clock signal to both M counter 202 and A counter 204. Therefore, M counter 202 and A counter 204 count down together from their initial counts. In the present exemplary embodiment, however, M counter 202 and A counter 204 are configured to count down from different initial counts. More particularly, M counter 202 is configured to count down from a higher initial count than A counter 204. Consequently, A counter 204 reaches its terminal count before M counter 202.

In the present exemplary embodiment, prescaler 206 is initially configured to divide by a modulus P+1. When A counter 204 reaches its terminal count, its output signal 210 toggles state and A counter 204 ceases to count further until M counter 202 reaches its terminal count and its output signal 212 toggles state. During this period (i.e., when A counter 204 has reached its terminal count while M counter 202 has not), prescaler 206 is configured to divide by modulus P. When M counter 202 reaches its terminal count, its output signal 212 toggles state and it sends an output signal 214 to phase detector 108.

Thus, the period of time that prescaler 206 divides by P is defined by the difference in the count values of M counter 202 and A counter 204. The period of time that prescaler 206 divides by P+1 is defined by the count value of A counter 204. When M counter 202 reaches its terminal count, M counter 202 and A counter 204 are re-loaded with their initial counts, then this process can be repeated.

Figure 3:
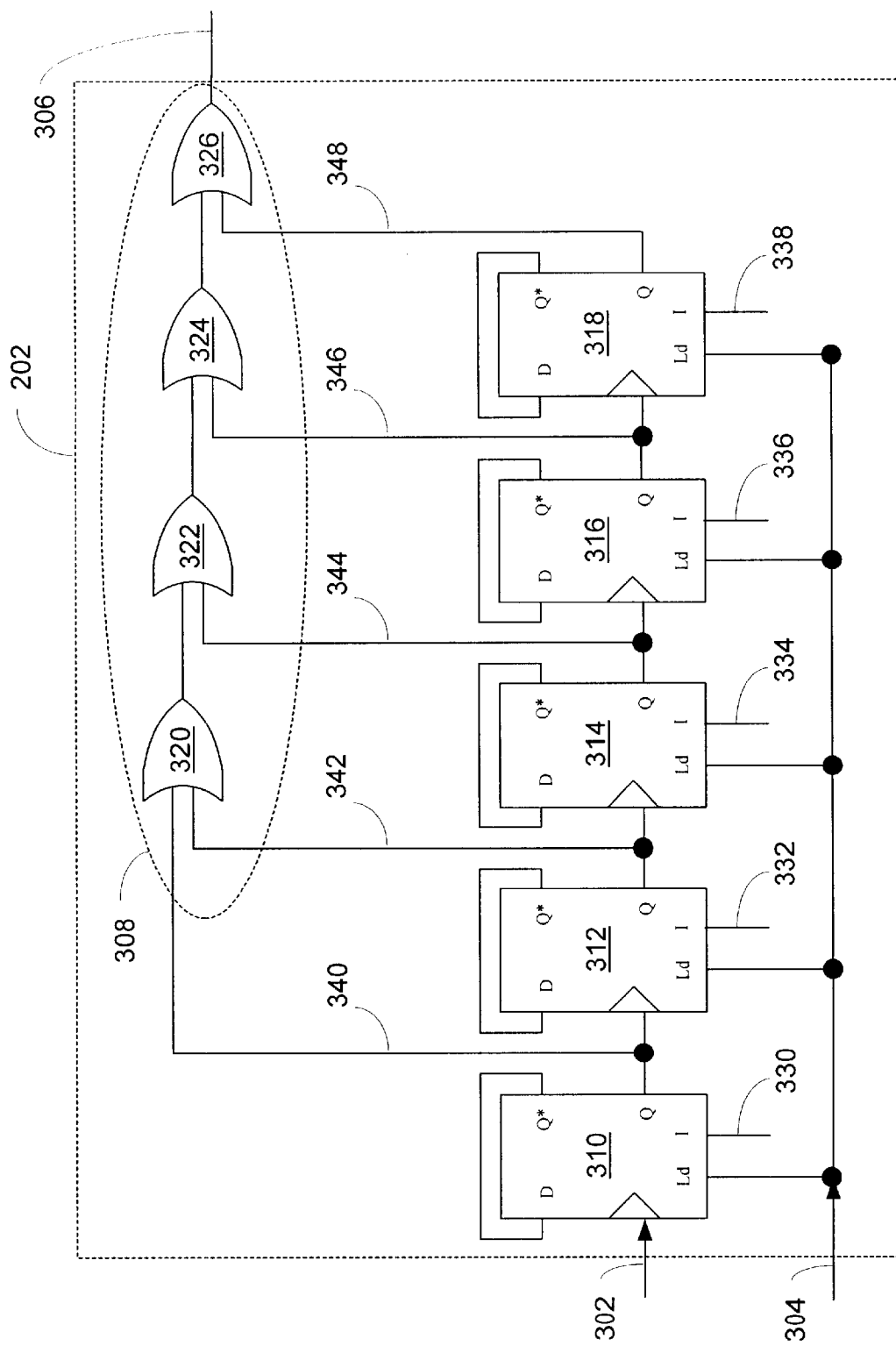
FIG. 3 is a block diagram of a portion of the PLL circuit depicted in FIG. 2 in accordance with one exemplary embodiment of the present invention.

With reference now to FIG. 3, in one exemplary embodiment, M counter 202 includes a plurality of flip-flops (i.e., flip-flops 310, 312, 314, 316, and 318). More particularly, flip-flops 310, 312, 314, 316, and 318 are configured as the register bits of M counter 202. For the sake of convenience and clarity, only the configuration of M counter 202 has been described and depicted. But it should be recognized that A counter 204 can be configured in a similar manner as M counter 202. Additionally, M counter 202 is depicted in FIG. 3 as being 5 bits in length. It should be recognized, however, that M counter 202 can be configured to be any number of bits in length. For example, M counter 202 can be configured with more or less flip-flops.

As described earlier, M counter 202 can be programmed with an initial count value. Moreover, the initial count value of M counter 202 can be programmed using a parallel programming scheme or a serial programming scheme. In a parallel programming scheme, all of the register bits for M counter 202 are applied in parallel and latched concurrently. However, parallel programming has the disadvantage that it requires more interface lines. In a serial programming scheme, the register bits are sequentially loaded over a single line into a shift register and then latched into the M counter 202. Thus, it requires less interface lines than parallel programming. In some applications, however, serial programming can be time consuming and result in undesirable delay.

As described above, the initial count of M counter 202 can be programmed by latching its register bits. More particularly, with reference to FIG. 3, each flip-flop 310, 312, 314, 316, and 318 includes an input (i.e., input 330, 332, 334, 336, and 338, respectively). Flip-flops 310, 312, 314, 316, and 318 can be programmed by applying a logic "1" or "0" to inputs 330, 332, 334, 336, and 338. For example, M counter 202 can be programmed with an initial count of 31 by applying a logic High or "1" to inputs 330, 332, 334, 336, and 338. In parallel programming, the logic High or "1" can be applied directly and concurrently to inputs 330, 332, 334, 336, and 338. In serial programming, the logic High or "1" can be applied sequentially to the shift register before being applied concurrently to inputs 330, 332, 334, 336, and 338. After M counter 202 is programmed with an initial count, each subsequent positive-going transition on a clock (CLK) line 302 causes M counter 202 to decrement its value by one.

As depicted in FIG. 3, M counter 202 also includes a terminal count detection circuit 308. In one exemplary embodiment, detection circuit 308 is configured to detect a terminal count of 0 (zero). More particularly, in the present exemplary embodiment, detection circuit 308 includes OR gates 320, 322, 324, and 326 with inputs 340, 342, 344, 346, and 348, respectively. Inputs 340 and 342 are connected to OR gate 320. The output from OR gate 320 and input 344 are connected to OR gate 322. The output from OR gate 322 and input 346 are connected to OR gate 324. The output from OR gate 324 and input 348 are connected to OR gate 326. In the present embodiment, the output from OR gate 326 is output signal 306 and it is the output signal of the terminal count detection circuit 308.

Thus, in the present configuration of the present exemplary embodiment, output 306 of detection circuit 308 is at a logic High or "1" when any one input 340, 342, 344, 346, or 348 is at a logic High or "1". Output 306 is at a logic Low or "0" only when all of the inputs 340, 342, 344, 346, and 348 are at a logic Low or "0". This signifies that M counter 202 has reached its terminal count of 0 (zero).

Output 306 then can be used to re-load the pre-programmed initial count of M counter 202 to start the counting process over again. For example, if flip-flops 310, 312, 314, 316, and 318 have an active low Load signal input then output signal 306 can be directly fed back to input signal 304 to cause the re-load process. Output 306 can also be used as a circuit input to the phase detector 108 that is driven by M counter 202.

As described above, the initial count of M counter 202 can be set through inputs 330, 332, 334, 336, and 338. M counter 202 then counts down from this value until it reaches its terminal count. For example, assume again that the desired initial count of M counter 202 is 31. As describe earlier, M counter 202 can be programmed with this initial count by applying a logic High or "1" to inputs 330, 332, 334, 336, and 338. Assume now that the desired initial count of M counter 202 is to be changed to 21. To accomplish this, a logic Low or "0" is applied to inputs 332 and 336. As noted earlier, this can be time consuming and result in undesirable delay.

Figure 4:
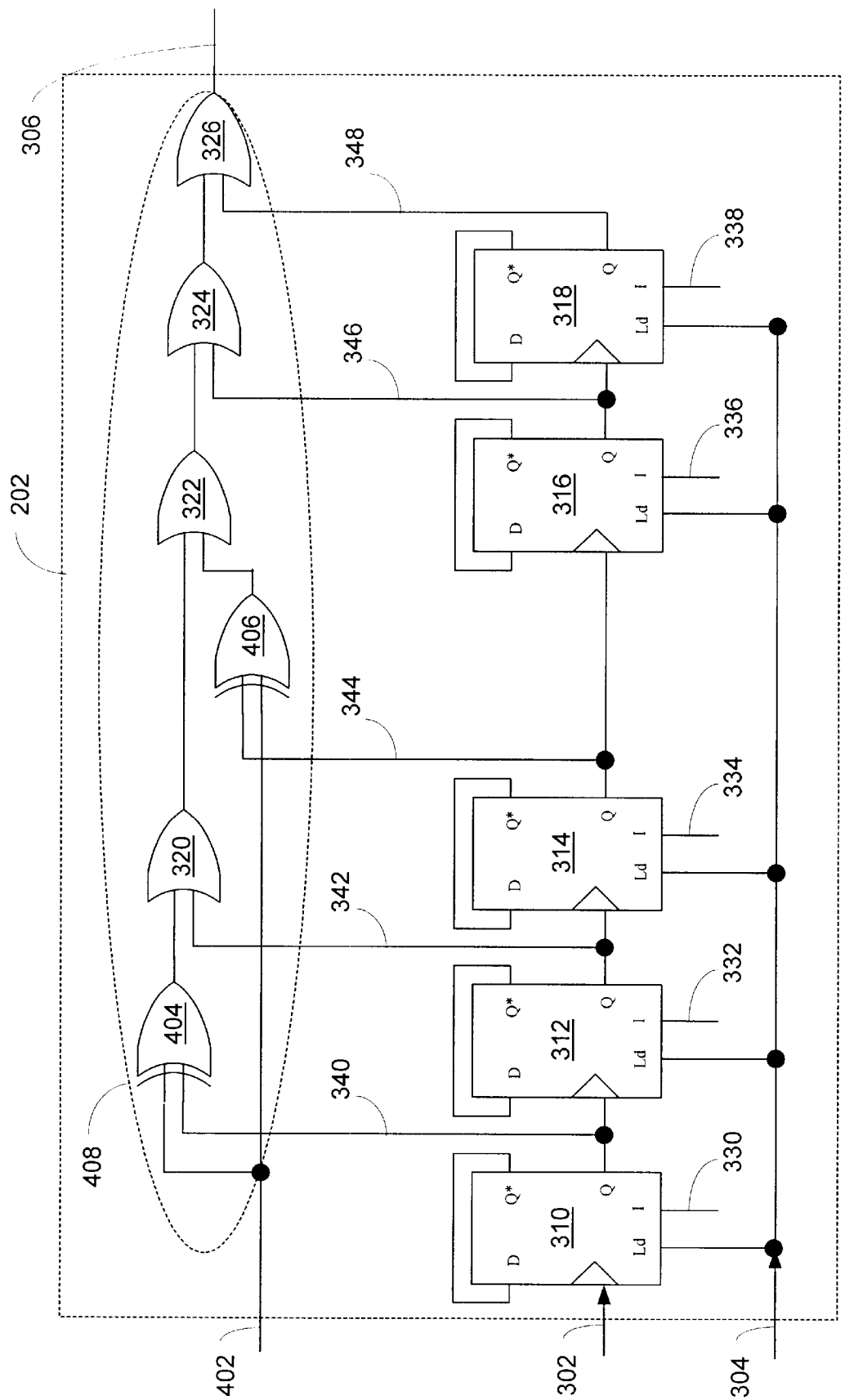
FIG. 4 is a block diagram of a portion of the PLL circuit depicted in FIG. 2 in accordance with another exemplary embodiment of the present invention.

With reference now to FIG. 4, in another exemplary embodiment of the present invention, M counter 202 includes a detection circuit 408 configured to detect a non-zero terminal count. As such, the effective total count of M counter 202 can be altered without altering the initial count of M counter 202 and without reprogramming flip-flops 310, 312, 314, 316, and 318. For example, assume again that M counter 202 is programmed with an initial count of 31 and configured with detection circuit 308 (FIG. 3) that is configured to detect a terminal count of 0 (zero). In this configuration, M counter 202 has a total count of 31 because it counts down from 31 to 0 (zero) one number at a time (i.e., 31, 30, 29, . . . , 2, 1, 0). Now assume that M counter 202 is configured with detection circuit 408 that is configured to detect a non-zero terminal count, such as 5. In this configuration, M counter 202 now has an effective total count of 26 because it counts down from 31 to 5 rather than to 0 (zero).

As alluded to above, the exemplary embodiment depicted in FIG. 4 is configured to detect a terminal count of 5. As such, in this exemplary embodiment, detection circuit 408 includes two exclusive-OR (XOR) gates 404 and 406. As depicted in FIG. 4, XOR gate 404 is connected to input 340 and XOR gate 406 is connected to input 344. XOR gates 404 and 406 are also connected to a control line 402. Consequently, when control line 402 is at a logic Low or "0", detection circuit 408 detects a terminal count of zero. More particularly, output 306 is at a logic Low or "0" only when each input 340, 342, 344, 346, and 348 is at a logic Low or "0". But when control line 402 is at a logic High or "1", detection circuit 408 detects a terminal count of 5 rather than 0 (zero). More particularly, output 306 is at a logic Low or "0" when inputs 340 and 344 are at a logic High or "1" and inputs 342, 346, and 348 are at a logic Low or "0".

In this manner, control line 402 alters the effective total count of M counter 202 by an offset. More particularly, in the present embodiment, the count value of M counter 202 is decreased by an offset of 5 when a logic High or "1" is applied to control line 402. When a logic Low or "0" is applied to control line 402, the count value of M counter 202 returns to it's original value. Thus, the count value of M counter 202 can be altered without re-programming flip-flops 310, 312, 314, 316, and 318. It should be recognized, however, that detection circuit 408 can be modified to detect a terminal count of any number. For example, by connecting XOR gate 406 between input 346 and OR gate 324 rather than between input 344 and OR gate 322, the terminal count can be altered to 9.

In another exemplary embodiment, detection circuit 408 can be configured to effectively increase the total count value or division ratio of M counter 202 by using a "positive counting sensing with over-load" configuration. In this configuration, the "normal" state of M counter 202 can be defined as the HOP=1 condition. The count value is "over-loaded" (i.e., programmed to a higher value) by the absolute value of the altered terminal count. For example, when the offset is 5, the "normal" state of M counter 202 can be defined as being 26 rather than 31. Thus, when control line 402 is at a logic High or "1", the count value of M counter 202 is 26. When control line 402 is at a logic Low or "1", the count value of M counter 202 increases to 31. In this manner, the count value of M counter 202 can be view as being increased rather than decreased.

In still another exemplary embodiment, detection circuit 408 can be configured to effectively increase the total count value of M counter 202 by using a "negative count sensing" configuration. More particularly, M counter 202 can be allowed to roll over to its maximum count value after it has reached its zero value For example, if the maximum count value of M counter 202 is 31, then it counts down in the following sequence ( . . . 3, 2, 1, 0, 31, 30, 29, . . . ). Thus, a count value of 31 can be viewed as a −1 (negative one). By sensing a negative, non-zero count state, the effective count value can be increased. However, it is important that there is no condition in which the same count value is considered both a valid positive initial count value and a valid negative terminal count value. In other words, the altered terminal count is greater than the initial count value and less-than or equal-to the maximum count value.

For example, assuming again that the initial count value and the maximum count value for M counter 202 are 31, then −1 (negative one) cannot be used as the terminal count because this state would be detected immediately rather than 32 counts later. Instead, if the initial count value of M counter 202 is set to 30, then −1 (negative one) can be used as the altered terminal count because after 31 counts, when M counter 202 rolls over, the −1 (negative one) state can be detected. More specifically, in this example the count down would appear as: 30, 29, . . . , 1, 0, 31. At 31, the −1 (negative one) state can be detected as the altered terminal count.

If the desired negative count value (31 in the previously example) falls within the valid positive programmed count range of the counter, an additional most significant bit can be added to the counter to increase its maximum possible total count value. This can provide a range of unused negative count values above the valid programmed count range of the counter. In the above example, adding another bit to M counter 202 would increase the maximum count value to 63.

As described above, M counter 202 can be configured to detect a non-zero terminal count state utilizing either the "positive counting sensing with overload" or the "negative count sensing" configuration. However, in accordance with one aspect of the present invention, A counter 204 is configured to detect a non-zero terminal count state utilizing only the "positive counting sensing with over-load" configuration. As described above, in the "negative count sensing" configuration, the counter is allowed to roll over to its maximum count value after it has reached its zero value. However, A counter 204 already rolls over after reaching its zero value. More particularly, as described above, A counter 204 is configured with a smaller initial count value than M counter 202. As such, A counter 204 reaches its terminal count ahead of M counter 202. Thus, A counter 204 rolls over as M counter 202 continues to count. Therefore, utilizing the "negative count sensing" configuration to alter the terminal count of A counter 204 can result in a larger than desired $N_{TOTAL}$.

With reference to FIG. 4, thus far, control line 402 has been described and depicted as being configured to shift detection circuit 408 between a first state and a second state. In the first state, detection circuit 408 detects a first termination count. In the second state, detection circuit 408 detects a second termination count. In accordance with one aspect of the present invention, the first and second termination counts differ by an off-set. It should be recognized, however, that detection circuit 408 can be connected to one or more additional control lines 402 that can be configured to shift detection circuit 408 between any number of states.

Having thus described various embodiments of the present invention, the following description will relate to the use of the present invention as an indirect phase-locked frequency synthesizer. It should be recognized, however, that the present invention can be used in any number of applications. For example it can be applied to any closed loop control system where multiple control values are desired. An example of this would be a heating/cooling system with two temperature settings, one for day and one for night.

A common method of generating a radio signal at a desired frequency is the technique known as indirect frequency synthesis by phase-lock. More particularly, in time division duplex heterodyne transceiver architectures, the incoming desired receive (RX) signal is mixed with a local oscillator (LO) signal and frequency translated down to a lower intermediate frequency (IF) for further signal processing. Thus, the LO signal differs in frequency from the desired RX signal by the frequency of the desired IF signal. However, the frequency of the transmit (TX) output signal equals the frequency of the desired receive signal and is, therefore, different in frequency from the LO signal.

Although two PLLs can be used, it is desirable in many applications to use a single PLL for both the TX output and the LO functions. For example, using a single PLL can reduce circuit complexity, current consumption, and size. However, when a single PLL is used, the frequency of the PLL needs to be changed rapidly between the TX frequency and the LO frequency as the radio alternately switches between transmit and receive modes. In such a heterodyne architecture, the absolute values of the TX and LO frequencies may vary as the user tunes the radio across the band of interest, but the difference in frequency between the two frequencies remains a constant, equal in value to the IF frequency.

In a conventional PLL, the register bit values of M counter 202 and A counter 204 are re-programmed at each transition between transmit and receives modes. However, a settling time is required when a PLL changes frequency for its output signal to become stable prior to use. Given a fixed amount of time available between transmit and receive modes, the length of time required to serially program M counter 202 and A counter 204 decreases the amount of time available for the PLL to settle. As such, it is desirable to alter the output frequency of the PLL without reprogramming M counter 202 and A counter 204.

Accordingly, in one exemplary embodiment, with reference to FIG. 4, the output frequency of a PLL can be altered by configuring M counter 202 and A counter 204 to detect non-zero terminal counts. For example, assume that the IF frequency is 10.7 MHz and that the output frequency of the PLL is to be reduced by 10.7 MHz. Also assume that the TX output frequency is 915 MHz, which would require a LO frequency ($F_{OUT}$) of 904.3 MHz. Assume a reference frequency ($F_{REF}$) of 12.8 MHz and a divide-by-R ratio of 128. The total count ($N_{TOTAL}$) and the altered count offset ($N_{HOP}$) can be calculated using the following equations:

$$N_{TOTAL}=F_{OUT} \div (F_{REF} \div R)=9043 \quad \text{(Eq. 1)}$$

$$N_{HOP}=F_{IF} \div (F_{REF} \div R)=107 \quad \text{(Eq. 2)}$$

Assuming that a 32/33 dual-modulus prescaler (P=32) is used, the values of M, A, $M_{EFF}$ and $A_{EFF}$ can be calculated using the following equations:

$$N_{TOTAL}=A*(P+1)+(M-A)*P=M*P+A \quad \text{(Eq. 3)}$$

$$M=INT(N_{TOTAL} \div P) \ (INT=\text{Integer portion})=282 \quad \text{(Eq. 4)}$$

$$A=N_{TOTAL}-M*P=19 \quad \text{(Eq. 5)}$$

$$M_{EFF}=INT((N_{TOTAL}+N_{HOP}) \div P)(INT=\text{Integer portion})=285 \quad \text{(Eq. 6)}$$

$$A_{EFF}=(N_{TOTAL}+N_{HOP} - M_{EFF}*P)=30 \quad \text{(Eq. 7)}$$

The absolute value of the terminal count value for M counter 202 and A counter 204 are calculated as the difference between their initial programmed value and the effective value. Thus, in the present example, the altered terminal counts of M counter 202 and A counter 204 are 3 and 11, respectively. As an increase in the count values of M counter 202 and A counter 204 is desired, either negative count sensing or positive count sensing with over-load can be used.

For M counter 202, the positive count sensing with programming over-load can be used for its simplified hardware solution (3 additional XOR gates vs. 8 additional XOR gates).

For A counter 204, both methods require an additional most significant bit to be added to increase the maximum possible count value. Since the number of XOR gates added differs by only one between the methods, negative count sensing was chosen to keep the original, intuitive count value as the value being programmed.

When HOP=0, A counter 204 reaches terminal count at the zero count state and the over-loaded M counter 202 reaches terminal count at the count=3 state producing the programmed total divide count value of Ntotal and in turn the programmed LO frequency. But, when HOP=1, A counter 204 reaches terminal count at the count=−11 state and the over-loaded M counter 202 reaches terminal count at the zero count state producing a total divide count of Ntotal+Nhop and in turn the higher TX frequency. Thus, a PLL circuit configured in the manner described above can change frequencies without reprogramming M counter 202 or A counter 204.

Although the present invention has been described in conjunction with particular exemplary embodiments illustrated in the appended drawing figures, various modifications can be made without departing from the spirit and scope of the present invention. For example, although a single control line 402 (FIG. 1) is depicted, it should be recognized that multiple control lines can be used to facilitate detection of multiple terminal counts. For example, the addition of a second control line would allow the detection of up to four different terminal count states without the need for re-programming. Therefore, the present invention should not be construed as limited to the specific form shown in the drawings and described above.

We claim:

1. A counter for a phase-locked loop (PLL) comprising:
   a plurality of flip-flops;
   a detection circuit connected to said flip-flops, wherein said detection circuit is configured to detect a terminal count; and
   a control line connected to said detection circuit,
     wherein said control line is configured to shift said detection circuit from a first state to a second state, and
     wherein said detection circuit is configured to detect a terminal count of zero when in said first state and a non-zero terminal count when in said second state.

2. The counter of claim 1, wherein said flip-flops are configured with an initial count value, a maximum count value, and wherein said terminal count is greater than said initial count value and less-than or equal-to said maximum count value when said detection circuit is in said second state.

3. The counter of claim 1, wherein said detection circuit comprises at least one OR gate, and wherein said control line comprises at least one exclusive-OR (XOR) gate having an input connected to an output of one of said plurality of flip-flops and an output connected to an input of said OR gate.

4. A phase lock loop (PLL) comprising:
   a phase detector;
   a loop filter connected to said phase detector;
   a voltage controller oscillator (VCO) connected to said loop filter;
   a prescaler connected to said VCO; and
   a down counter connected to said prescaler and said phase detector, said down counter having a terminal count, wherein said down counter includes a control line configured to alter said terminal count by a predetermined off-set.

5. The PLL of claim 4, wherein said down counter further comprises:
   a detection circuit configured to detect said terminal count; and
   wherein said control line is connected to said detection circuit, said control line configured to switch said detection circuit between a first state and a second state, wherein said detection circuit detects said terminal count without said off-set in said first state and with said off-set in said second state.

6. The PLL of claim 5, wherein said detection circuit is configured to detect a terminal count of zero when in said first state, and a non-zero terminal count when in said second state.

7. The PLL of claim 5, wherein said down counter is configured with a normal count value and an over-load count value, wherein said over-load count value is equal to the sum of said normal counter value and said off-set.

8. The PLL of claim 5, wherein said down counter is configured with an initial count value, a maximum counter value, and wherein said terminal count is greater than said initial count value and less-than or equal-to said maximum count value when said detection circuit is in said second state.

9. The PLL of claim 5, wherein said down counter further comprises:
- a plurality of flip-flops;
- at least one OR gate; and
- at least one exclusive-OR (XOR) gate having an input connected to an output of one of said plurality of flip-flops and an output connected to an input of said OR gate.

10. The PLL of claim 4, wherein said down counter further comprises:
- a main counter connected to said prescaler and said phase detector, said main counter having a terminal count, wherein said control line includes a first-control line configured to alter said terminal count of said main counter by a first off-set; and
- an auxiliary counter connected to said main counter and said prescaler, said auxiliary counter having a terminal count, wherein said control line includes a second-control line configured to alter said terminal count of said auxiliary counter by a second off-set.

11. The PLL of claim 10, wherein said first off-set is 3 and said second off-set is 11.

12. The PLL of claim 11, wherein said main counter is configured with a maximum count value of 285 and a terminal count of zero, wherein said first-control line is configured to alter said terminal count to 3.

13. The PLL of claim 12, wherein said auxiliary counter is configured with an initial count value of 19, a maximum count value of 31, and a terminal count of zero, wherein said second-control line is configured to alter said terminal count to 21.

14. A method of altering the terminal count of a counter in a phase lock loop (PLL), said method comprising:
- configuring a detection circuit to detect a terminal count for the counter; and
- configuring a control line connected to said detection circuit to alter said terminal count between a first state and a second state, wherein said detection circuit detects a terminal count of zero in said first state and detects a non-zero terminal count in said second state.

15. The method of claim 14, wherein the counter includes an initial count value, a maximum count value, and wherein said detection circuit detects a terminal count that is greater then said initial count value and less-than or equal-to said maximum count value when said detection circuit is in said second state.

16. The method of claim 14, wherein said detection circuit includes at least one OR gate and said control line includes at least one exclusive-OR (XOR) gate, and wherein said method further comprising:
- connecting an output of said XOR gate to an input of said OR gate.

17. A counter for a PLL comprising:
- a plurality of flip-flops capable of a maximum count value and configured with an initial count value and a maximum count value;
- a detection circuit connected to said flip-flops, wherein said detection circuit is configured to detect a terminal count; and
- a control line connected to said detection circuit,
  - wherein said control line is configured to alter said detection circuit between a first state and a second state,
  - wherein said terminal count is zero when said detection circuit is in said first state, and
  - wherein said terminal count is greater than said initial count value and less-than or equal to said maximum count value when said detection circuit is in said second state.

18. The counter of claim 17 further comprising:
- at least one OR gate; and
- at least one exclusive-OR (XOR) gate having an input connected to an output of one of said plurality of flip-flops and an output connected to an input of said OR gate.

19. A counter for a PLL comprising:
- a plurality of flip-flops configured with an initial count value;
- a detection circuit connected to said flip-fops, wherein said detection circuit is configured to detect a terminal count; and
- a control line connected to said detection circuit,
  - wherein said control line is configured to alter said detection circuit between a first state and a second state,
  - wherein said terminal count is zero when said detection circuit is in said first state, and
  - wherein said terminal count is greater than zero and less than the initial count value when said detection circuit is in said second state.

20. The counter of claim 19 further comprising:
- at least one OR gate; and
- at least one exclusive-OR (XOR) gate having an input connected to an output of one of said plurality of flip-flops and an output connected to an input of said OR gate.

* * * * *